US010554181B1

(12) United States Patent
Banerjee et al.

(10) Patent No.: US 10,554,181 B1
(45) Date of Patent: Feb. 4, 2020

(54) COMPARATOR PREAMPLIFIER ROBUST TO VARIATIONS IN SUPPLY AND COMMON-MODE

(71) Applicant: Analog Devices International Unlimited Company, Limerick (IE)

(72) Inventors: Debopam Banerjee, Bangalore (IN); Maitrey Kamble, Mumbai (IN); Sandeep Monangi, Srikakulam (IN); Michael C. W. Coln, Lexington, MA (US)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/271,019

(22) Filed: Feb. 8, 2019

(51) Int. Cl.
  *H03F 1/30* (2006.01)
  *H03F 3/45* (2006.01)
  *H03M 1/46* (2006.01)
  *G05F 1/595* (2006.01)

(52) U.S. Cl.
  CPC .......... *H03F 1/301* (2013.01); *H03F 3/45273* (2013.01); *H03M 1/46* (2013.01); *G05F 1/595* (2013.01)

(58) Field of Classification Search
  CPC ...... H03F 1/301; H03F 3/45273; H03M 1/46; G05F 1/595
  USPC .......................................... 341/161, 163, 172
  See application file for complete search history.

(56) References Cited

U.S. PATENT DOCUMENTS

| | | | |
|---|---|---|---|
| 7,282,994 B2 | 10/2007 | Gopinathan et al. | |
| 7,664,612 B2 | 2/2010 | Bauer et al. | |
| 7,741,981 B1* | 6/2010 | Wan | H03M 1/02 341/110 |
| 7,928,880 B2* | 4/2011 | Tsukamoto | H03M 1/1061 341/144 |

* cited by examiner

*Primary Examiner* — Khai M Nguyen
(74) *Attorney, Agent, or Firm* — Schwegman Lundberg & Woessner, P.A.

(57) ABSTRACT

An electronic circuit comprises a comparator circuit including an input circuit stage and an output circuit stage, and an input stage supply circuit coupled to a circuit supply rail and the input circuit stage. The input stage supply circuit includes a voltage generator circuit and a regulating circuit. The voltage generator circuit includes a replicate circuit of a portion of the input circuit stage to generate a voltage that is less than a voltage of the circuit supply rail and varies with the voltage of the circuit supply rail and device parameters of the replicate circuit. The regulating circuit generates a regulated input stage supply using the generated voltage.

23 Claims, 6 Drawing Sheets

COMPARATOR PREAMPLIFIER ROBUST TO VARIATIONS IN SUPPLY AND COMMON-MODE

FIELD OF THE DISCLOSURE

This document relates to integrated circuits and in particular to pre-amplifier circuits for comparator circuits.

BACKGROUND

Comparator circuits are used to detect or determine differences between two voltages or currents. For example, comparators can be used in successive approximation register (SAR) analog-to-digital converters (ADCs) to resolve the results of bit trials during the conversion process. However, performance of comparator circuits can be sensitive to variations in voltage of the circuit supply rail and to variations in the common mode voltage of the inputs to the comparator circuit.

SUMMARY OF THE DISCLOSURE

This document relates generally to comparator circuits and more specifically to preamplifier (preamp) circuits for comparator circuits that are robust to variations in supply voltage and input common mode voltage. In some aspects, an electronic circuit comprises a comparator circuit and an input stage supply circuit. The comparator circuit includes an input stage and an output stage. The input stage supply circuit is coupled to a circuit supply rail and the input circuit stage of the comparator. The input stage supply circuit includes a voltage generator circuit that includes a replicate circuit of a portion of the input circuit stage to generate a voltage that is less than a voltage of the circuit supply rail and varies with the voltage of the circuit supply rail and device parameters of the replicate circuit, and a regulating circuit configured to generate a regulated input stage supply using the generated voltage.

In some aspects, an electronic system includes an analog-to-digital converter (ADC) circuit. The ADC circuit includes a digital-to-analog converter (DAC) circuit, a comparator circuit operatively coupled to the DAC circuit and including an output circuit stage and a preamp circuit stage, and a preamp supply circuit coupled to a circuit supply rail and the preamp circuit stage. The preamp supply circuit includes a voltage generator circuit and a regulating circuit. The voltage generator circuit includes a replicate circuit of a portion of the preamp circuit stage to generate a voltage that is less than a voltage of the circuit supply rail and varies with the voltage of the circuit supply rail and device parameters of the replicate circuit. The regulating circuit generates a regulated preamp supply using the generated voltage.

In some aspects, an ADC circuit includes a digital-to-analog converter (DAC) circuit, and a comparator circuit including an output circuit stage and a preamp circuit stage. The preamp circuit stage includes a differential input transistor pair, and a preamp supply circuit coupled to a circuit supply rail and the preamp circuit stage. The preamp supply circuit includes a voltage generator circuit and a regulating circuit. The voltage generator circuit generates a voltage that is less than a voltage of the circuit supply rail and varies with the voltage of the circuit supply rail and an input common mode voltage, wherein the voltage generator circuit includes a differential input transistor pair matching the differential input transistor pair of the preamp circuit stage. The regulating circuit configured to generate a regulated preamp supply using the generated voltage.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
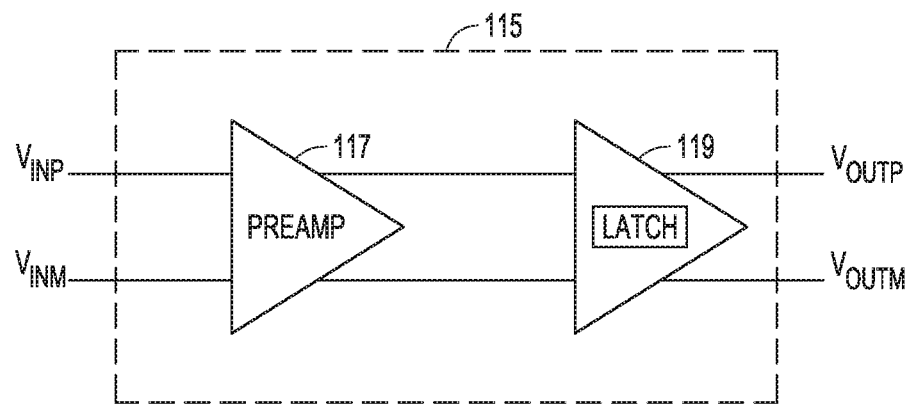
FIG. 1 is a block diagram of an example of portions of a comparator circuit.

FIG. 1 is a block diagram of an example of portions of a comparator circuit. The comparator circuit 115 includes an input circuit stage and an output circuit stage. The input circuit stage is a preamplifier (preamp) circuit stage 117. The circuit supply rail $V_{DD}$ of the preamp circuit stage 117 can be 1.8 volts (1.8V) to 3.6V. The full scale of the input signal to the preamp circuit may be 200 millivolts (200 mV) lower than the supply voltage (e.g., a 2.5V to 5V peak-to-peak differential input signal). The output circuit stage 119 can include a latch to capture the result of a comparison of the inputs. The circuit supply rail of the output circuit stage 119 can be lower (e.g., 1.1V) and still provide the desired performance.

The performance of the preamp circuit stage 117 can be affected by large differences in supply voltage for different applications of the preamp circuit. For example, an input signal with a large peak-to-peak signal swing may result in clipping of the input signal if the application has a low circuit supply rail voltage. The problem is compounded with variation in input common mode voltage. The comparator circuit 115 may be included in an ADC circuit.

Figure 2:
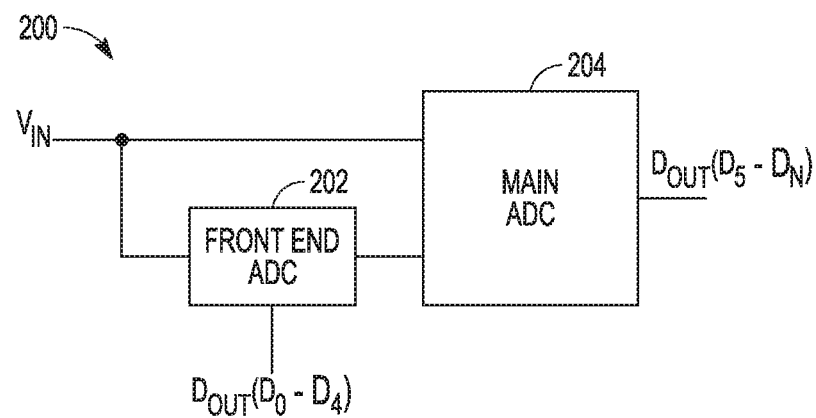
FIG. 2 is a block diagram of an example of a two-stage analog-to-digital converter circuit.

FIG. 2 is a block diagram of an example of two-stage ADC circuit 200 (sometimes called a pipeline ADC) including a front-end ADC circuit 202 and a main ADC circuit 204. The front-end ADC circuit 202 resolves the first most significant bits (MSBs) of the conversion of the input (e.g., the first five MSBs D0-D4). The output of the front-end ADC is subtracted from the input and loaded onto the slower but more accurate main ADC circuit to resolve the remaining bits of the conversion.

Figure 3:
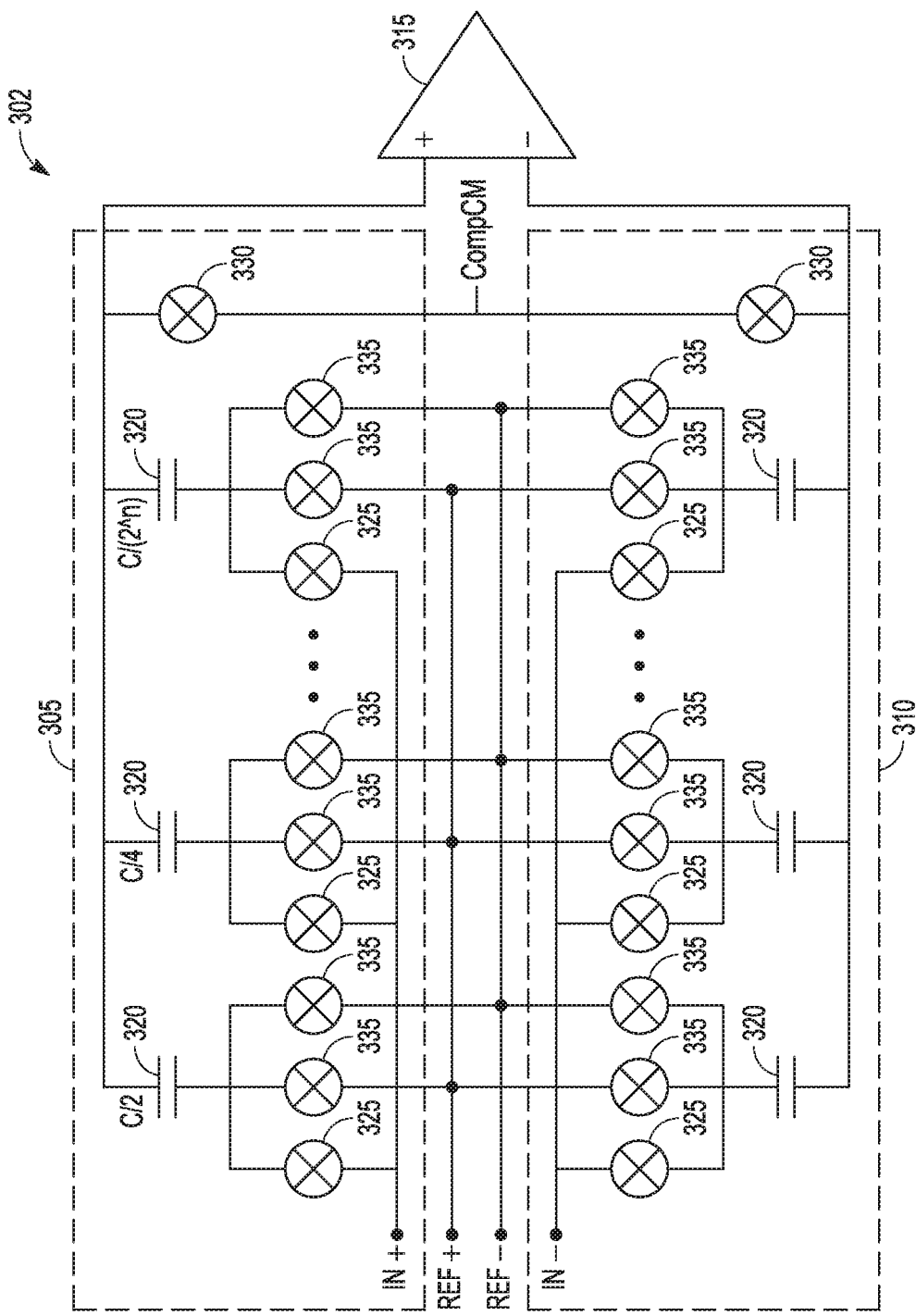
FIG. 3 is a block diagram of an example of a differential successive approximation register analog-to-digital converter circuit.

FIG. 3 is a functional block diagram of an example of a differential SAR ADC circuit such as front-end ADC circuit 202 of FIG. 2. The SAR ADC circuit 302 includes a positive digital-to-analog converter (DAC) 305, a negative DAC 310, and a comparator circuit 315. Each DAC includes weighted bit capacitors 320. In the example, the capacitors are weighted as C/2, C/4 ... C/($2^N$), where N is the number of bits (e.g., N=5) in the DACs and C is the total capacitance of the bit capacitors added together. A differential analog input voltage (IN+, IN−) is sampled onto the bit capacitors with respect to the common mode of the comparator (CompCM) by closing switches 325 and 330. The input voltage is held on the capacitors by opening switches 330, then opening switches 325. The top plates of the capacitors are at the CompCM voltage.

The positive DAC 305 and the negative DAC 310 are also connected to positive and negative reference voltage (REF+, REF−). As part of the successive approximation routine, bit trials for each of the bit capacitors are performed iteratively. In a bit trial, the output of the positive DAC 305 and the output of the negative DAC 310 are applied to the inputs of the comparator circuit 315. Based on the output of the comparator circuit, a bit capacitor is connected to either REF+ or REF− using switches 335. If the bit capacitor is connected to REF+ the bit of the digital value corresponding to the bit capacitors is assigned a logic value '1', and if the bit capacitor is connected to REF+ the bit of the digital value corresponding to the bit capacitors is assigned a logic value '0'. Conversion then proceeds to the next bit capacitor until all bits of the digital value are determined.

Figure 4:
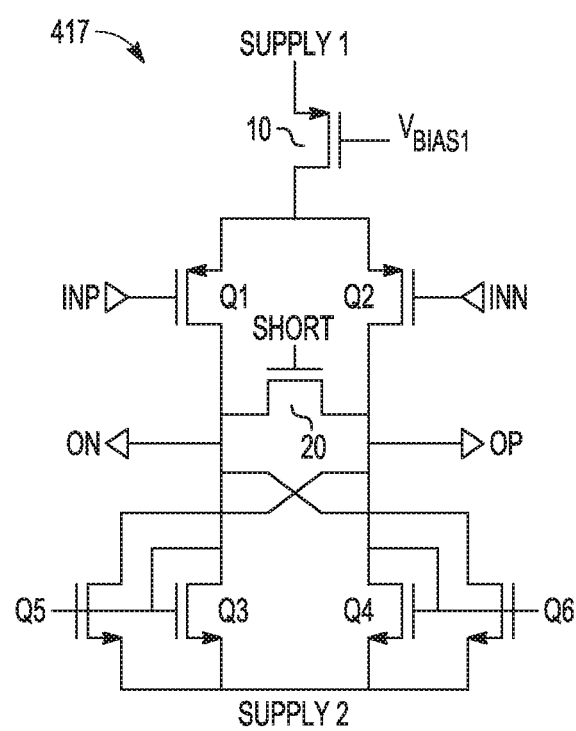
FIG. 4 is a circuit diagram of an example of a preamp circuit for a comparator circuit.

FIG. 4 is a circuit diagram of an example of a preamp circuit 417 for a comparator circuit such as comparator circuit 315 of FIG. 3 for SAR ADC circuit 302. For unhindered operation with minimum circuit supply rail and maximum input common mode, the input transistor pair Q1 and Q2 and the tail current transistor (transistor labeled "10") of the preamp circuit 417 typically have a large area. The tail current transistor has a large area to reduce the drain-source saturation voltage (VDSAT) to ensure that the tail current transistor and the input transistor pair remain in the saturation region even for the lowest anticipated circuit supply rail voltage and highest input common mode voltage.

However, a large tail current transistor increases the capacitance on the tail-node and increases the power up time. The power up time can be critical to performance of a comparator used in an ADC circuit because it directly adds to the overall conversion time of the ADC. Additionally, a large tail current transistor can be slow to recover form an overdrive condition. An overdrive condition occurs when there is large change in charge during a conversion step (e.g., from the midpoint (REF/2) to a negative LSB). During the conversion step, all the nodes of the ADC circuit need to settle to within reasonable ranges of normal operating conditions before the subsequent conversion decision (e.g., a bit trial). If the capacitance on the tail-node is high, a significant amount of time is spent by the tail current transistor to charge the capacitance and the result of the conversion decision may be wrong.

It is preferred to have the smallest possible sizes for transistors Q1 and Q2 such that their parasitic caps are minimal for optimal SAR ADC design. An approach to allow unhindered operation of the comparator circuit without using large devices for the input transistor pair and the transistor tail current is to generate a separate circuit supply rail just for the preamp circuit stage of the comparator. If this internal separate circuit supply rail $V_{DD\_INT}$ varies with the external supply VDD and device parameters of the preamp circuit stage, smaller and better-performing transistors can be used in the preamp circuit stage.

Figure 5:
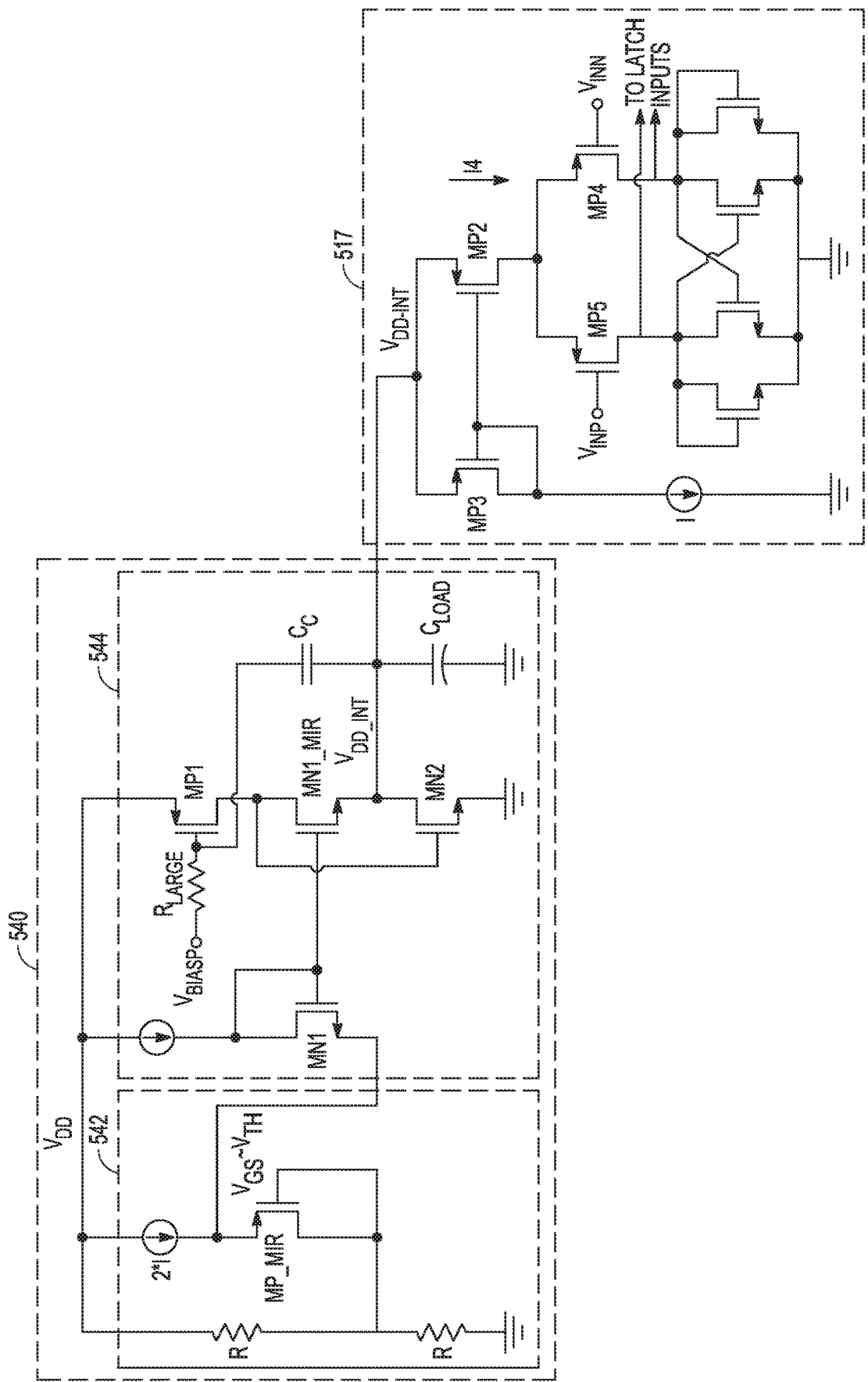
FIG. 5 is a circuit diagram of an example of portions of a preamp circuit stage for a comparator circuit and includes a preamp supply circuit.

FIG. 5 is a circuit diagram of an example of a preamp circuit stage 517 for a comparator circuit. The output stage of the comparator is not shown. The preamp circuit stage 517 includes differential input transistor pair MP4 and MP5, tail current transistor MP2, and tail current mirror transistor MP3.

FIG. 5 also shows a circuit diagram of an example of a preamp supply circuit 540. The preamp supply circuit 540 includes a voltage generator circuit 542 and a regulating circuit 544. The voltage generator circuit 542 includes a voltage divider circuit. In the example of FIG. 5, the voltage divider circuit is a resistive divider circuit that includes the two resistors (R) connected between the $V_{DD}$ circuit supply rail and circuit ground. The voltage generator circuit 542 produces a preamp supply voltage that is less than $V_{DD}$. Reducing the preamp supply voltage allows smaller devices to be used for the input transistor pair (MP4, MP5) and for the current tail transistors (MP2, MP3) of the preamp circuit of FIG. 4.

The regulating circuit 544 may act as a buffer stage for the voltage produced by the voltage generator circuit 542. The regulating circuit 544 generates a regulated preamp supply using the voltage generated by the voltage generator circuit 542. In some aspects, the regulating circuit 544 is a low drop out (LDO) regulating circuit. Other aspects of the regulating circuit are described below.

The voltage generator circuit 542 includes a replicate of a portion of the preamp circuit stage 517. This replicate circuit is used to make the voltage generator circuit 542 vary with device parameters of the preamp circuit stage 517. In the example of FIG. 5, the replicate circuit includes transistor MP-mir. This transistor is a copy of the transistors used in the input transistor pair of the preamp circuit stage 517. The preamp supply voltage generated by the voltage generator circuit 542 is VDD_INT. Because the transistor MP-mir is a replicate transistor, the threshold voltage of transistor MP-mir is also the threshold voltage of transistors MP2, MP3, MP4, and MP5 of the preamp circuit stage 517. The preamp circuit supply rail varies with the voltage of the main circuit supply rail and device parameters of the replicate circuit.

The transistor used for the input transistor pair (MP4, MP5), the replicate transistor (MP_mir), and the current tail transistors (MP2, MP3) can be chosen from transistors in the process that have lower $V_{TH}$, so that $V_{TH}$ is half of that of the transistors used in the preamp circuit of FIG. 4 without sacrificing reliability. The input transistors MP4, MP5 are sized to remain in saturation so that the gate-to-source voltage ($V_{GS}$) of the devices is approximately $V_{TH}$. This allows the input transistor pair in preamp circuit stage 517 to be reduced in size from the input transistor pair of preamp circuit 417 of FIG. 4. The smaller device size reduces the capacitance on the tail node and hence reduces the power up time of the preamp circuit stage 517.

Figure 6:
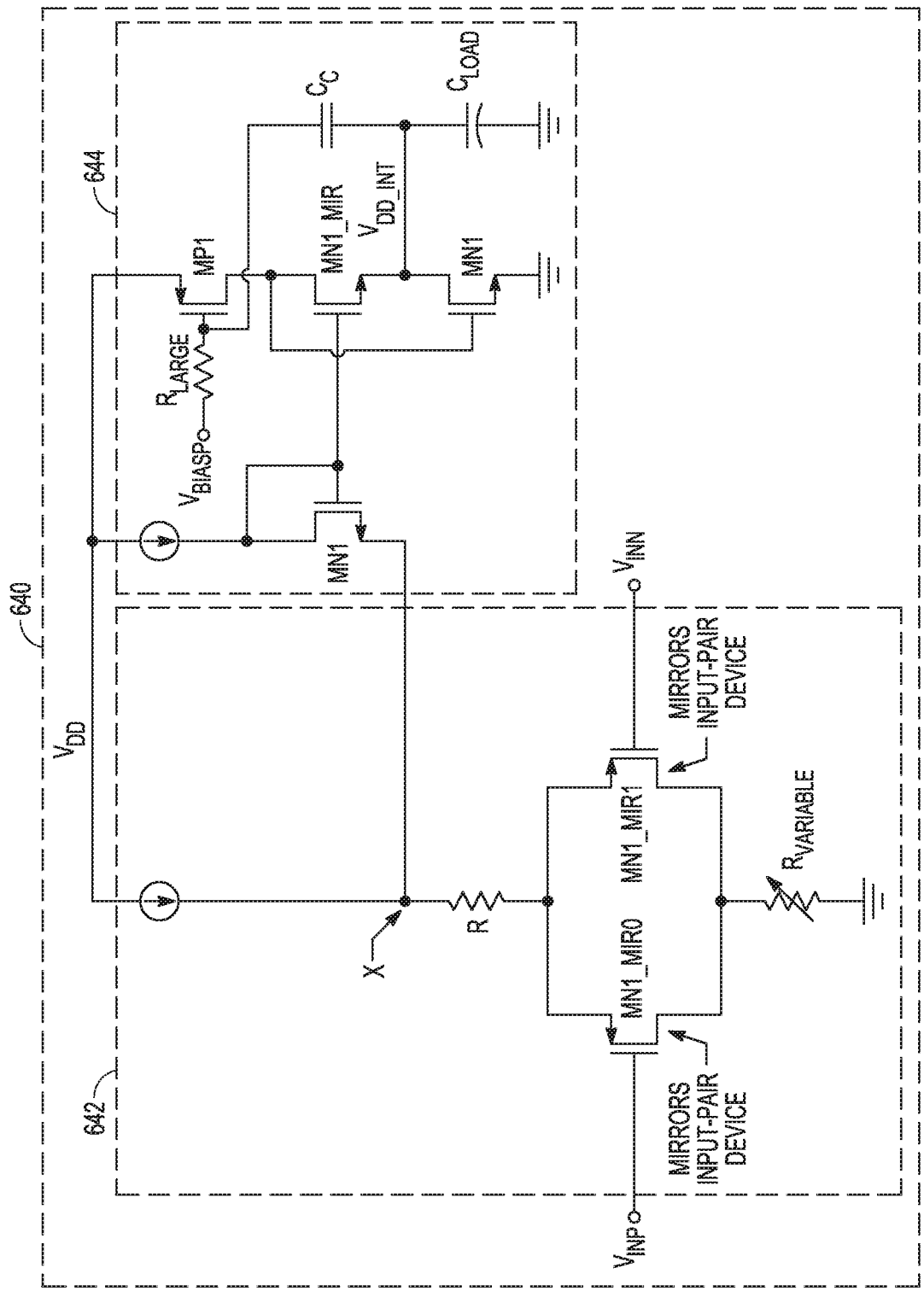
FIG. 6 is a circuit diagram of portions of another example of a preamp supply circuit.

FIG. 6 is a circuit diagram of another example of a preamp supply circuit 640. The output node ($V_{DD\_INT}$) is connected to a preamp circuit stage as in FIG. 5.

The preamp supply circuit 640 includes a voltage generator circuit 642 and a regulating circuit 644. In the example of FIG. 6, the replicate circuit of a portion of the voltage generator circuit 642 includes transistors MP_mir0 and MP_mir1 which are a copy of the differential input transistor pair MP5 and MP4 of the preamp circuit stage 517 of FIG. 5. Transistors MP_mir0 and MP_mir1 are connected to the differential input of the preamp circuit stage the transistors mirror transistors MP5, MP4. The voltage $V_X$ at node X in FIG. 6 is $$V_X = V_{INCM} + V_{GS} + I*R, \quad (1)$$

where $V_{INCM}$ is the common mode input voltage, $V_{GS}$ is the gate to source voltage of the transistors of the replicate circuit, and I*R is voltage drop of resistor R. The voltage $V_{DD\_INT}$ at the output node of the preamp supply circuit 640 is approximately equal to $V_X$. Thus, the preamp supply circuit 640 generates a voltage that varies with the voltage of the circuit supply rail, the device parameters of the circuit replicate, and the common mode of an input signal to the preamp circuit stage. Therefore, the circuit of FIG. 6 is robust to variations in the input common mode which may not always be $V_{DD}/2$.

In the example of FIG. 6, the inputs $V_{INP}$, $V_{INN}$ to the input transistor pair MP5, MP4 of the preamp circuit stage are also connected to the input transistor pair MP_mir0, MP_mir1 of the replicate circuit of the voltage generator circuit 642. The circuit node "X" may not track the input common mode when there is an overdrive condition.

Figure 7:
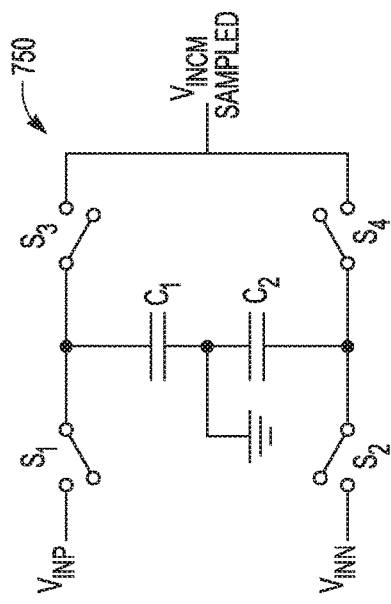
FIG. 7 is a circuit diagram of a sampling circuit.

FIG. 7 is a circuit diagram of a sampling circuit 750 that can improve the performance of the preamp supply circuit 640 of FIG. 6. The sampling circuit 750 samples the input common mode voltage at the differential input of the comparator circuit and applies the input common mode voltage to the differential input transistor pair (MP_mir0, MP_mir1) of the replicate circuit. The sampling circuit 750 includes two capacitors (C1, C2) and four switches (S1-S4). During a sampling phase switches S1 and S2 are connected to $V_{INP}$, $V_{INN}$, to sample the differential input voltage of the preamp circuit stage 517 onto the capacitors, and switches S3, S4 are open.

During a following phase, switches S1 and S2 are open and switches S3 and S4 are closed to short the capacitor terminals together. Closing switches S3 and S4 also samples the input common mode ($V_{INCM}$) onto the inputs of the differential input transistor pair (MP_mir0, MP_mir1) of the replicate circuit. This improves the tracking by the replicate circuit of the input common mode of the preamp circuit.

If the preamp circuit stage is included in the comparator of an ADC circuit, the input common mode may be sampled onto the replicate circuit in a timed relationship to an analog-to-digital conversion by the ADC circuit. For example, in the ADC circuit of FIG. 3, the switches 325, 335 may sample the input voltage onto the DAC circuits 305, 310. A clock signal can be used to sample the sample the input common mode voltage onto the differential input transistor pair of the replicate circuit in a timed relationship to the sampling of the input onto the DAC circuits. In certain aspects, the input common mode voltage is sampled onto the differential input transistor pair of the replicate circuit in a timed relationship to a bit trial by the ADC circuit. The clock signal that controls the switches does not impact the signal-to-noise ratio of the ADC circuit and the clock signal may be slow and noisy.

Returning to FIG. 6, the regulating circuit 644 includes a current mirror comprised of transistors MN1 and MN1_mir. The current mirror transistors are n-type field effect transistors (NFETs) such as n-type metal oxide semiconductor (NMOS) transistors. The current mirror provides drive to buffer the output of the voltage generator circuit 642. However, the current mirror adds a slight shift of a gate to source voltage $V_{GS}$ of transistor MN1 to $V_X$, and it is desired for the preamp supply voltage $V_{DD\_INT}$ to be approximately equal to $V_X$. The regulating circuit 644 includes a flipped-voltage-follower circuit in its output stage to cancel the $V_{GS}$ shift of the current mirror. The voltage follower circuit includes the MN1_mir transistor and transistor MN2 arranged below the MN1_mir transistor.

The regulating circuit 644 also includes a biasing circuit coupled to the flipped-voltage-follower circuit. The biasing circuit includes transistor MP1, the voltage bias $V_{BIASP}$, and the resistor $R_{LARGE}$ coupled to the gate of MP1. The biasing circuit as shown in FIG. 6 may introduce circuit noise. In some aspects, the regulating circuit 642 includes a noise filter circuit coupled to the biasing circuit to mitigate the noise in the output stage of the regulating circuit 644.

Figure 8:
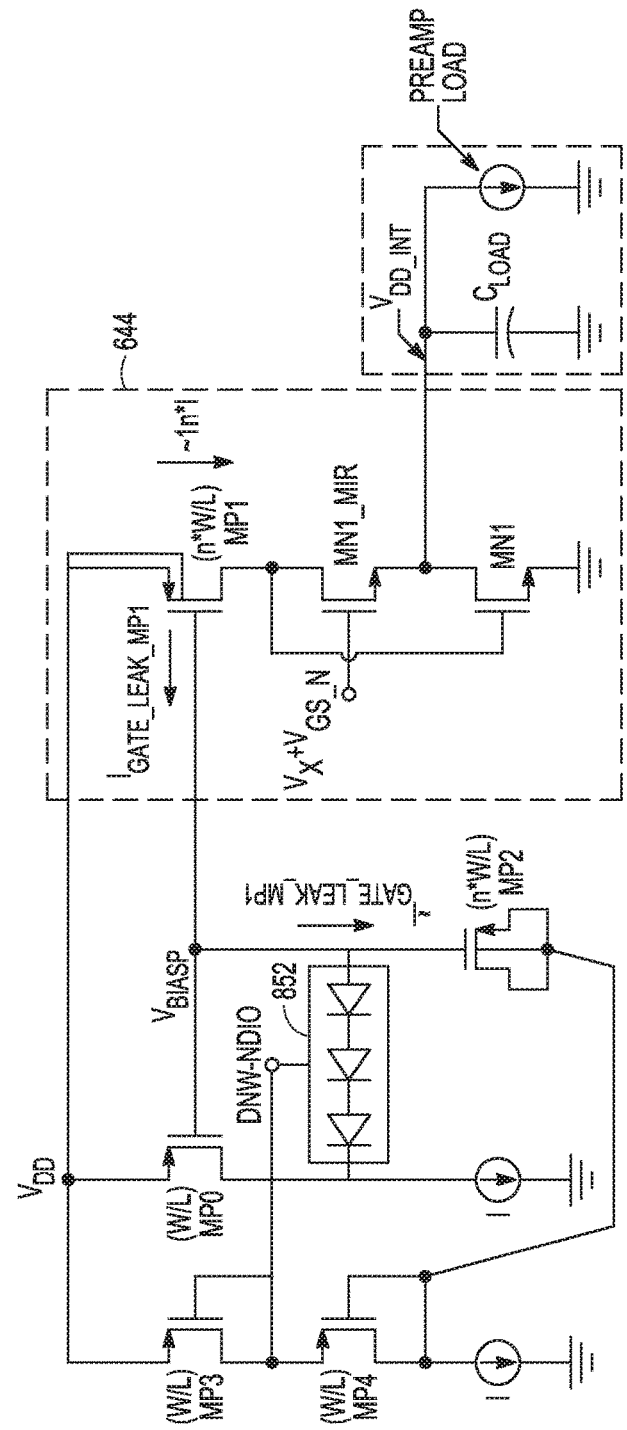
FIG. 8 is a circuit diagram of a portion of an example of a regulating circuit and a noise filter circuit.

FIG. 8 is a circuit diagram of a portion of the regulating circuit 644 of FIG. 6 and a noise filter circuit. Transistors MP1, MN1_mir, and MN2 correspond to the same transistors in the regulating circuit 644 of FIG. 6. The noise filter adds a large time constant (τ) to the $V_{BIASP}$ node to filter out the noise. To make the time constant large enough, a very large resistance R is implemented using the series connected diodes of diode chain 852. The diodes are near-zero biased as the current through the diodes is small. Because the current through the near-zero biased diodes is small, the effective resistance of the diode chain is very high. The high resistance together with the capacitance at the anode connection of the diode chain (e.g., the capacitance of the gate oxide of transistors MP1 and MP2) will result in a noise filter with a large time constant.

While the diode chain 852 provides a good noise filter, the diode chain 852 is susceptible to leakage currents flowing through the diodes. This will lead to a mismatch between the $V_{GS}$ of the mirror transistors and which causes a significant current mismatch. To compensate this leakage current and make sure the compensation tracks over PVT (process-voltage-temperature variation), the cancellation circuitry includes transistors PMOS transistors MP2, MP3, and MP4. The gate leakage current is applied to the gate of transistor MP2 and the drain and source region of MP2 are connected to diode-connected transistor MP4. MP2 and MP4 are matched transistors. Transistors MP3 and MP4 are connected to the n-well of the diodes. The cancellation circuitry minimizes the voltage drop across the diodes to minimize leakage current.

The devices, systems and methods described herein provide a pre-amp circuit that is robust to variations in the main circuit supply voltage and to variations in input common mode voltage. A preamp circuit supply is derived from the main circuit supply voltage. The preamp circuit supply may vary with one or both of the main circuit supply voltage and the input common mode voltage to maintain optimized biasing of the preamp circuit. This allows the preamp circuit to have reduced circuit area over conventional approaches without a decrease in performance.

Additional Description and Aspects

Aspect 1 can include subject matter (such as an electronic circuit) comprising a comparator circuit and an input stage supply circuit. The comparator circuit includes an input stage and an output stage. The input stage supply circuit is coupled to a circuit supply rail and the input circuit stage of the comparator. The input stage supply circuit includes a voltage generator circuit that includes a replicate circuit of a portion of the input circuit stage to generate a voltage that is less than a voltage of the circuit supply rail and varies with the voltage of the circuit supply rail and device parameters of the replicate circuit, and a regulating circuit configured to generate a regulated input stage supply using the generated voltage.

In Aspect 2, the subject matter of Aspect 1 includes a pre-amplifier (preamp) circuit stage as the input circuit stage, a preamp supply circuit coupled to the circuit supply rail and the preamp circuit stage as the input stage supply circuit, the replicate circuit includes a portion of the preamp circuit stage, and the regulating circuit is configured to generate a regulated preamp supply using the generated voltage.

In Aspect 3, the subject matter of Aspect 2 optionally includes a preamp circuit stage that includes a differential input transistor pair. The voltage generator circuit includes a voltage divider circuit, and the replicate circuit includes a transistor that is a copy of a transistor of the differential input transistor pair and is coupled to the voltage divider circuit.

In Aspect 4, the subject matter of one or both of Aspects 2 and 3 optionally include a voltage generator circuit configured to generate a voltage that varies with the voltage of the circuit supply rail, the device parameters of the replicate circuit, and a common mode of an input signal to the preamp circuit stage.

In Aspect 5, the subject matter of Aspect 4 optionally includes a preamp circuit stage that includes a differential input transistor pair coupled to a differential input of the comparator circuit, and the replicate circuit includes a copy of the differential input transistor pair coupled to the differential input of the comparator circuit.

In Aspect 56, the subject matter or Aspect 5 optionally includes a sampling circuit configured to sample the input common mode voltage at the differential input of the comparator circuit and apply the input common mode voltage to the differential input transistor pair of the replicate circuit.

In Aspect 7, the subject matter of one or any combination of Aspects 1-6 optionally includes regulating circuit includes a low dropout (LDO) circuit.

In Aspect 8, the subject matter of one or any combination of Aspects 1-7 optionally includes a regulating circuit that includes a flipped-voltage-follower circuit.

In Aspect 9, the subject matter of Aspect 8 optionally includes a biasing circuit coupled to the flipped-voltage-follower circuit; and a noise filter circuit coupled to the biasing circuit.

In Aspect 10, the subject matter of Aspect 9 optionally includes a noise filter circuit that includes one or more near-zero biased diodes.

In Aspect 11, the subject matter of Aspect 10 optionally includes cancellation circuitry configured to cancel noise in the noise filter circuit resulting from leakage current of the one or more near-zero biased diodes.

Aspect 12 can include subject matter (such as an electronic system) or can optionally be combined with one or any combination of Aspects 1-11 to include such subject matter, comprising a first analog-to-digital converter (ADC) circuit. The first ADC circuit including a digital-to-analog converter (DAC) circuit, a comparator circuit operatively coupled to the DAC circuit and including an output circuit stage and a pre-amplifier (preamp) circuit stage, and a preamp supply circuit coupled to a circuit supply rail and the preamp circuit stage. The preamp supply circuit includes a voltage generator circuit that includes a replicate circuit of a portion of the preamp circuit stage to generate a voltage that is less than a voltage of the circuit supply rail and varies with the voltage of the circuit supply rail and device parameters of the replicate circuit, and a regulating circuit configured to generate a regulated preamp supply using the generated voltage.

In Aspect 13, the subject matter of Aspect 12 optionally includes a preamp circuit stage that includes a differential input transistor pair coupled to a differential input of the comparator circuit, and the replicate circuit includes a copy of the differential input transistor pair coupled to the differential input of the comparator circuit. The generated voltage varies with the voltage of the circuit supply rail, the device parameters of the replicate circuit, and a common mode of the differential input of the comparator circuit.

In Aspect 14, the subject matter of Aspect 13 optionally includes a sampling circuit configured to sample the input common mode voltage at the differential input of the comparator circuit, and apply the input common mode voltage to the differential input transistor pair of the replicate circuit stage in a timed relationship to an analog-to-digital conversion by the first ADC circuit.

In Aspect 15, the subject matter of Aspect 14 optionally includes a preamp circuit stage that includes a differential input transistor pair, the voltage generator circuit includes a voltage divider circuit, and the replicate circuit includes a transistor that is a copy of a transistor of the differential input transistor pair and is coupled to the voltage divider circuit. The generated voltage varies with the voltage of the circuit supply rail and parameters of the voltage divider circuit and the transistor coupled to the voltage divider circuit.

In Aspect 16, the subject matter of one or any combination of Aspects 12-15 optionally includes a regulating circuit that includes a flipped-voltage-follower circuit.

In Aspect 17, the subject matter of Aspect 16 optionally includes a biasing circuit coupled to the flipped-voltage-follower circuit, and a noise filter circuit coupled to the biasing circuit.

In Aspect 18, the subject matter of Aspect 17 optionally includes a noise filter circuit that includes one or more near-zero biased diodes.

In Aspect 19, the subject matter of Aspect 18 optionally includes cancellation circuitry configured to cancel noise in the noise filter circuit resulting from leakage current of the one or more diodes of the leakage current.

In Aspect 20, the subject matter of Aspect 19 optionally includes a second ADC circuit coupled to the output stage of the comparator circuit.

Aspect 21 can include subject matter (such as an analog-to-digital (ADC) converter circuit) or can optionally be combined with one or any combination of Aspects 1-20 to include such subject matter, comprising a digital-to-analog converter (DAC) circuit, a comparator circuit, and a pre-amplifier (preamp) supply circuit. The comparator circuit includes an output circuit stage and a preamp circuit stage that includes a differential input transistor pair. The preamp supply circuit is coupled to a circuit supply rail and the preamp circuit stage. The preamp supply circuit includes a voltage generator circuit configured to generate a voltage that is less than a voltage of the circuit supply rail and varies with the voltage of the circuit supply rail and an input common mode voltage, wherein the voltage generator circuit includes a differential input transistor pair matching the differential input transistor pair of the preamp circuit stage; and a regulating circuit configured to generate a regulated preamp supply using the generated voltage.

In Aspect 22, the subject matter of Aspect 21 optionally includes a first sampling circuit configured to sample an input voltage onto the DAC circuit and a second sampling circuit configured to sample the input common mode voltage onto the differential input transistor pair of the voltage generator circuit to the sampling of the input voltage onto the DAC circuit.

In Aspect 23, the subject matter of one or both of Aspects 21 and 22 optionally include a voltage generator circuit that includes a voltage divider circuit, and the generated voltage varies with the voltage of the circuit supply rail, the input common mode voltage, and device parameters of the differential input transistor pair and the voltage divider.

These non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An electronic circuit comprising:
    a comparator circuit including an input circuit stage and an output circuit stage; and
    an input stage supply circuit coupled to a circuit supply rail and the input circuit stage, wherein the input stage supply circuit includes:
        a voltage generator circuit that includes a replicate circuit of a portion of the input circuit stage to generate a voltage that is less than a voltage of the circuit supply rail and varies with the voltage of the circuit supply rail and device parameters of the replicate circuit; and
        a regulating circuit configured to generate a regulated input stage supply using the generated voltage.

2. The electronic circuit of claim 1, wherein the input circuit stage is a pre-amplifier (preamp) circuit stage, the input stage supply circuit is a preamp supply circuit coupled to the circuit supply rail and the preamp circuit stage, the replicate circuit includes a portion of the preamp circuit stage, and the regulating circuit is configured to generate a regulated preamp supply using the generated voltage.

3. The electronic circuit of claim 2, wherein the preamp circuit stage includes a differential input transistor pair, the voltage generator circuit includes a voltage divider circuit, and the replicate circuit includes a transistor that is a copy of a transistor of the differential input transistor pair and is coupled to the voltage divider circuit.

4. The electronic circuit of claim 2, wherein the voltage generator circuit is configured to generate a voltage that varies with the voltage of the circuit supply rail, the device parameters of the replicate circuit, and a common mode of an input signal to the preamp circuit stage.

5. The electronic circuit of claim 4, wherein the preamp circuit stage includes a differential input transistor pair coupled to a differential input of the comparator circuit, and the replicate circuit includes a copy of the differential input transistor pair coupled to the differential input of the comparator circuit.

6. The electronic circuit of claim 5, including a sampling circuit configured to sample the input common mode voltage at the differential input of the comparator circuit and apply the input common mode voltage to the differential input transistor pair of the replicate circuit.

7. The electronic circuit of claim 2, wherein the regulating circuit includes a low dropout (LDO) circuit.

8. The electronic circuit of claim 2, wherein the regulating circuit includes a flipped-voltage-follower circuit.

9. The electronic circuit of claim 8, wherein the regulating circuit includes:
    a biasing circuit coupled to the flipped-voltage-follower circuit; and
    a noise filter circuit coupled to the biasing circuit.

10. The electronic circuit of claim 9, wherein the noise filter circuit includes one or more near-zero biased diodes.

11. The electronic circuit of claim 10, wherein the noise filter circuit includes cancellation circuitry configured to cancel noise in the noise filter circuit resulting from leakage current of the one or more near-zero biased diodes.

12. An electronic system comprising a first analog-to-digital converter (ADC) circuit, the first ADC circuit including:
    a digital-to-analog converter (DAC) circuit;
    a comparator circuit operatively coupled to the DAC circuit and including an output circuit stage and a pre-amplifier (preamp) circuit stage; and
    a preamp supply circuit coupled to a circuit supply rail and the preamp circuit stage, wherein the preamp supply circuit includes:

a voltage generator circuit that includes a replicate circuit of a portion of the preamp circuit stage to generate a voltage that is less than a voltage of the circuit supply rail and varies with the voltage of the circuit supply rail and device parameters of the replicate circuit; and a regulating circuit configured to generate a regulated preamp supply using the generated voltage.

13. The electronic system of claim 12, wherein the preamp circuit stage includes a differential input transistor pair coupled to a differential input of the comparator circuit; the replicate circuit includes a copy of the differential input transistor pair coupled to the differential input of the comparator circuit; and wherein the generated voltage varies with the voltage of the circuit supply rail, the device parameters of the replicate circuit, and a common mode of the differential input of the comparator circuit.

14. The electronic system of claim 13, including a sampling circuit configured to:

sample the input common mode voltage at the differential input of the comparator circuit; and apply the input common mode voltage to the differential input transistor pair of the replicate circuit stage in a timed relationship to an analog-to-digital conversion by the first ADC circuit.

15. The electronic system of claim 12, wherein the preamp circuit stage includes a differential input transistor pair, the voltage generator circuit includes a voltage divider circuit, and the replicate circuit includes a transistor that is a copy of a transistor of the differential input transistor pair and is coupled to the voltage divider circuit; and wherein the generated voltage varies with the voltage of the circuit supply rail and parameters of the voltage divider circuit and the transistor coupled to the voltage divider circuit.

16. The electronic system of claim 12, wherein the regulating circuit includes a flipped-voltage-follower circuit.

17. The electronic system of claim 16, wherein the regulating circuit includes:

a biasing circuit coupled to the flipped-voltage-follower circuit; and a noise filter circuit coupled to the biasing circuit.

18. The electronic system of claim 17, wherein the noise filter circuit includes one or more near-zero biased diodes.

19. The electronic system of claim 18, wherein the noise filter circuit includes cancellation circuitry configured to cancel noise in the noise filter circuit resulting from leakage current of the one or more near-zero biased diodes.

20. The electronic system of claim 12, including a second ADC circuit coupled to the output stage of the comparator circuit.

21. An analog-to-digital converter (ADC) circuit comprising:

a digital-to-analog converter (DAC) circuit;

a comparator circuit including an output circuit stage and a pre-amplifier (preamp) circuit stage, wherein the preamp circuit stage includes a differential input transistor pair; and a preamp supply circuit coupled to a circuit supply rail and the preamp circuit stage, wherein the preamp supply circuit includes:

a voltage generator circuit configured to generate a voltage that is less than a voltage of the circuit supply rail and varies with the voltage of the circuit supply rail and an input common mode voltage, wherein the voltage generator circuit includes a differential input transistor pair matching the differential input transistor pair of the preamp circuit stage; and a regulating circuit configured to generate a regulated preamp supply using the generated voltage.

22. The ADC circuit of claim 21, including a first sampling circuit configured to sample an input voltage onto the DAC circuit and a second sampling circuit configured to sample the input common mode voltage onto the differential input transistor pair of the voltage generator circuit to the sampling of the input voltage onto the DAC circuit.

23. The ADC circuit of claim 21, wherein the voltage generator circuit includes a voltage divider circuit, and the generated voltage varies with the voltage of the circuit supply rail, the input common mode voltage, and device parameters of the differential input transistor pair and the voltage divider.

* * * * *